(12) United States Patent
Baumgartner et al.

(10) Patent No.: US 11,674,237 B2
(45) Date of Patent: Jun. 13, 2023

(54) METHOD FOR FABRICATING A CRYSTALLINE METAL-PHOSPHIDE HETERO-LAYER BY CONVERTING FIRST AND SECOND CRYSTALLINE METAL-SOURCE LAYERS INTO FIRST AND SECOND CRYSTALLINE METAL PHOSPHIDE LAYERS

(71) Applicant: International Business Machines Corporation, Armonk, NY (US)

(72) Inventors: Yannick Baumgartner, Thalwil (CH);
Bernd W. Gotsmann, Horgen (CH);
Jean Fompeyrine, Waedenswil (CH);
Lukas Czornomaz, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 1065 days.

(21) Appl. No.: 16/411,651

(22) Filed: May 14, 2019

(65) Prior Publication Data

US 2020/0362446 A1  Nov. 19, 2020

(51) Int. Cl.
*C30B 1/02* (2006.01)
*C30B 1/10* (2006.01)
(Continued)

(52) U.S. Cl.
CPC ............... *C30B 1/02* (2013.01); *C30B 1/026* (2013.01); *C30B 1/10* (2013.01); *H01L 21/02543* (2013.01); *H01L 43/10* (2013.01)

(58) Field of Classification Search
CPC .. C30B 1/00; C30B 1/02; C30B 1/023; C30B 1/026; C30B 1/10; C30B 23/00; C30B 23/02; C30B 23/04; C30B 25/00; C30B 25/02; C30B 25/04; C30B 29/00; C30B 29/10; C30B 29/14; C23C 14/00; C23C 14/04; C23C 14/06; C23C 14/14; C23C 14/16; C23C 14/58; C23C 14/5806; C23C 14/5846; C23C 16/00; C23C 16/04; C23C 16/06; C23C 16/22; C23C 16/28; C23C 16/40; C23C 16/409; H01L 21/0254; H01L 43/10
(Continued)

(56) References Cited

U.S. PATENT DOCUMENTS

2017/0260620 A1\*  9/2017  Cheah ............... C23C 14/5806
2018/0080136 A1\*  3/2018  Li ........................... C25D 3/20

FOREIGN PATENT DOCUMENTS

CN  108588713 A  9/2018

OTHER PUBLICATIONS

A. Garg, et al. publication entitled "Epitaxial growth of WO3 films on SrTiO3 and sapphire," J. Phys. D: Appl. Phys. vol. 33, pp. 1048-1053 (2000). (Year: 2000).\*

(Continued)

*Primary Examiner* — Kenneth A Bratland, Jr.
(74) *Attorney, Agent, or Firm* — Scully, Scott, Murphy & Presser, P.C.; Daniel P. Morris, Esq.

(57) ABSTRACT

Fabricating a crystalline metal-phosphide layer may include providing a crystalline base substrate and a step of forming a crystalline metal-source layer. The method may further include performing a chemical conversion reaction to convert the metal-source layer to the crystalline metal phosphide layer. One or more corresponding semiconductor structures can be also provided.

11 Claims, 5 Drawing Sheets

(51) Int. Cl.
   *H01L 21/02* (2006.01)
   *H01L 43/10* (2006.01)
(58) Field of Classification Search
   USPC .......... 117/4, 7–9, 84, 88–89, 105–106, 937, 117/939, 941
   See application file for complete search history.

(56) References Cited

OTHER PUBLICATIONS

M. Pi, et al. publication entitled "Pulsed laser deposition-assisted synthesis of porous WP2 nanosheet arrays integrated on graphite paper as a 3D flexible cathode for efficient hydrogen evolution," Journal of Power Sources, vol. 364, pp. 253-257 (2017). (Year: 2017).*
R.McKee publication entitled "Crystalline oxides on silicon: the first five monolayers," Physical Review Letters, vol. 81, pp. 3014-3017 (1998). (Year: 1998).*
Kumar, et al. publication entitled "Extremely high magnetoresistance and conductivity in the type-II Weyl semimetals WP2 and MoP2," Nature Communications, vol. 8, p. 1642 (2017). (Year: 2017).*
McKee, R.A., et al., "Crystalline Oxides on Silicon: The First Five Monolayers", Physical Review Letters, Oct. 5, 1998, pp. 3014-3017, vol. 81, No. 14.
Hills, R.D.Y., Current-voltage characteristics of Weyl semimetal semiconducting devices, Veselago lenses, and hyperbolic Dirac phase, Physical Review Letters B, Jun. 2017, pp. 214103-1-214103-13, vol. 95.
Wang, A., et al., "Large magnetoresistance in type-II Weyl semimetal WP2", https://arxiv.org/abs/1708.08877v1, Aug. 29, 2017, 6 pages.
Downing, C.A., et al., "Bielectron vortices in two-dimensional Dirac semimetals", Nature Communications, Oct. 12, 2017, 8 pages, vol. 8, Article 897.
Gooth, J., et al., "Thermal and electrical signatures of a hydrodynamic electron fluid in WP2", https://export.arxiv.org/ftp/arxiv/papers/1706/1706.05925.pdf, Accessed on May 14, 2019, 47 pages.

Pi, M., et al., "Phase-controlled synthesis of polymorphic tungsten diphosphide with hybridization of monoclinic and orthorhombic phases as a novel electrocatalyst for efficient hydrogen evolution", Journal of Power Sources, Received Dec. 28, 2016, Received in revised form Feb. 24, 2017, Accepted Mar. 10, 2017, pp. 138-143, vol. 349.
Pi, M., et al., "Phase-controlled synthesis and comparative study of α- and β-WP2 submicron particles as eflcient electrocatalysts for hydrogen evolution", Electrochimica Acta, Received Jun. 13, 2016, Received in revised form Sep. 1, 2016, Accepted Sep. 7, 2016, Available online Sep. 7, 2016, pp. 304-311, vol. 216.
Pi, M., et al., "Pulsed laser deposition-assisted synthesis of porous WP2 nanosheet arrays integrated on graphite paper as a 3D flexible cathode for efficient hydrogen evolution", Journal of Power Sources, Received Apr. 13, 2017, Received in revised form Jul. 22, 2017, Accepted Aug. 10, 2017, pp. 253-257.
Kumar, N., et al., "Extremely high magnetoresistance and conductivity in the type-II Weyl semimetals WP2 and MoP2", Nature Communications, Nov. 21, 2017, 8 pages, vol. 8, Article 1642.
Mathis, H., et al., "Reduction of WO3 by Phosphorus", Acta Chemica Scandinavica, Jan. 1991, pp. 781-784, vol. 45.
Garg, A., et al.,"Epitaxial growth of WO3 films on SrTiO3 and sapphire", Journal of Physics D: Applied Physics, May 2000, pp. 1048-1053, vol. 33.
Baum, Y., et al., "Current at a Distance and Resonant Transparency in Weyl Semimetals", Physical Review X, Received Aug. 27, 2015, published Dec. 21, 2015, pp. 041046-1-041046-11, vol. 5.
Pendry, J.B., "Negative Refraction for Electrons?", Science, Mar. 2, 2007, pp. 1226-1227, vol. 315.
Westrom, A., et al., "Designer Curved-Space Geometry for Relativistic Fermions in Weyl Metamaterials", Physical Review X, Received May 29, 2017, revised manuscript received Aug. 23, 2017, published Oct. 30, 2017 pp. 041026-1-041026-16, vol. 7.
Bai, C., et al., "A wavevector filter in inversion symmetric Weyl semimetal", Received Sep. 17, 2015 Accepted Dec. 1, 2015, Available online Dec. 9, 2015, Physics Letters A, pp. 764-767, vol. 380.

* cited by examiner

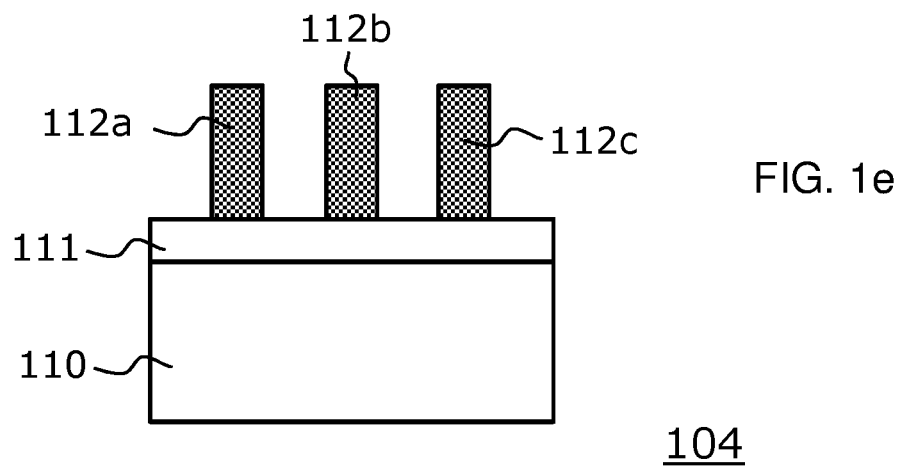
FIG. 1e
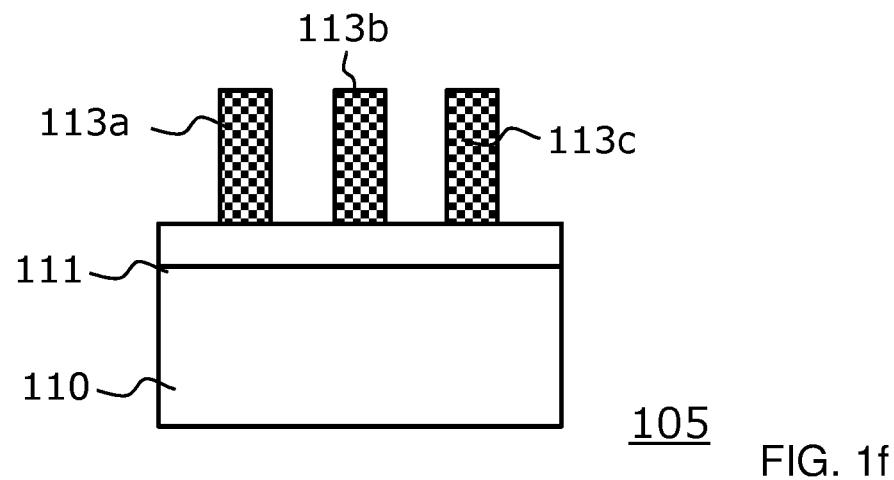
FIG. 1f
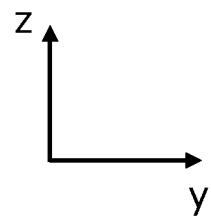

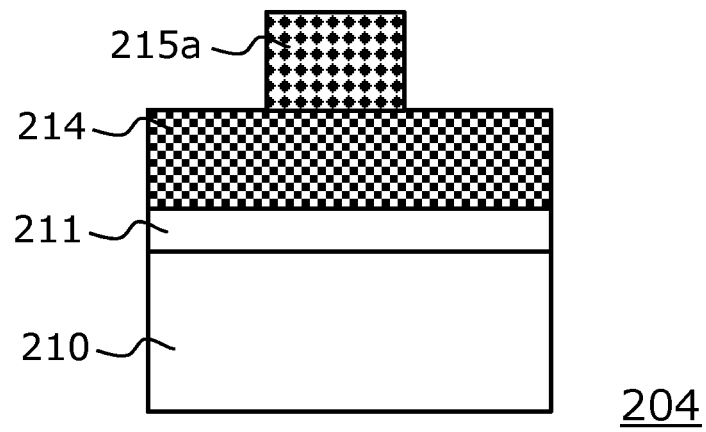
FIG. 2d
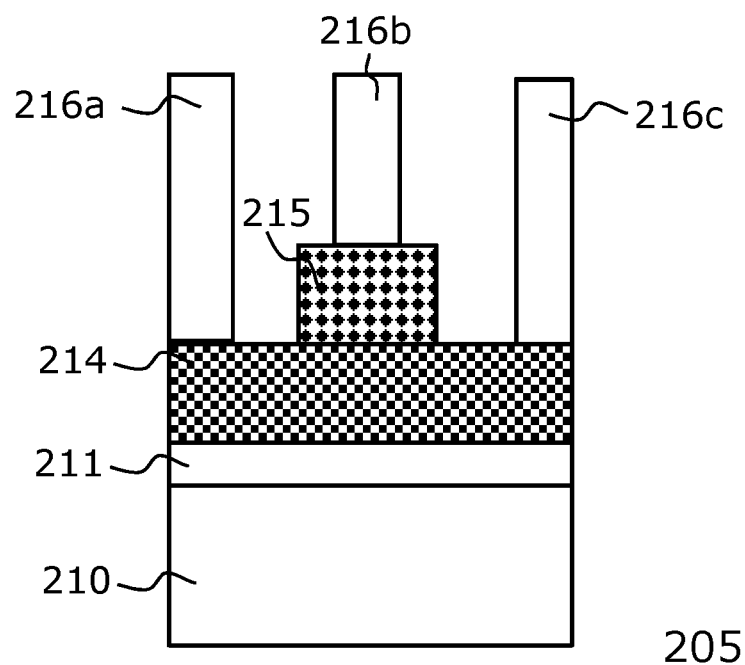
FIG. 2e
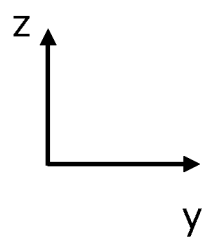

METHOD FOR FABRICATING A CRYSTALLINE METAL-PHOSPHIDE HETERO-LAYER BY CONVERTING FIRST AND SECOND CRYSTALLINE METAL-SOURCE LAYERS INTO FIRST AND SECOND CRYSTALLINE METAL PHOSPHIDE LAYERS

BACKGROUND

Embodiments of the invention relate generally to the fabrication of metal-phosphide crystals, in particular the fabrication of crystalline metal-phosphide layers. Embodiments of the invention also relate to corresponding devices and device structures.

A novel class of materials, Weyl semimetals, is being actively studied for potential applications in quantum computing, low power electronics, neuromorphic computing and highly-efficient energy conversion based on hydrogen. Their wide-range use stems from extraordinary transport characteristics, including high conductivity, large magnetoresistance, chiral optical effects, ultra-broad band absorption, and hydrodynamic transport.

One of the most promising materials of this class, tungsten diphosphide ($WP_2$), has already shown experimentally its expected electrical behavior as a correlated electronic system. $WP_2$ has several extreme properties that make it interesting:

It exhibits hydrodynamic electron transport effects stronger than reported in other materials. Furthermore, it combines conductivities similar to ordinary metals with record-high magnetoresistance. In addition, it shows promise as an efficient non-noble-metal hydrogen evolution reaction (HER) electrocatalysts.

The research and device fabrication in this field is limited due to the limited availability of $WP_2$ single crystals, which are not compatible with device fabrication (powders or slivers).

It is therefore desirable to provide improved fabrication methods for metal-phosphide crystals.

SUMMARY

According to a first aspect, the invention is embodied as a method for fabricating a crystalline metal-phosphide layer. The method comprises a step of providing a crystalline base substrate and a step of forming a crystalline metal-source layer. The method comprises a further step of performing a chemical conversion reaction to convert the metal-source layer to the crystalline metal phosphide layer.

Such a method facilitates an efficient fabrication of crystalline metal-phosphides.

The crystalline metal-source layer shall be understood as a layer that provides the metal as "a source" for the metal-phosphide layer to be formed. The metal-source layer may be in particular embodied as metal compound layer, i.e. as a layer that comprises a metal compound. More particularly, the crystalline metal-source layer may be a crystalline compound layer comprising the same metal as the metal phosphide layer.

According to an embodiment, the method comprises a step of forming a crystalline buffer layer on the crystalline base substrate and a step of forming the crystalline metal-source layer on the crystalline buffer layer.

This further facilitates an efficient fabrication of crystalline metal-phosphides.

According to another embodiment, the crystalline metal-source layer may be formed directly on the base substrate, e.g., without a buffer layer.

According to an embodiment, the base substrate comprises silicon. This may facilitate the use of large scale wafers as base substrate. The base substrate may have in particular a (100) crystal orientation. This further facilitate the use of large scale wafers as base substrate According to an embodiment, the crystalline buffer layer is a layer comprising $SrTiO_3$. According to another embodiment, the crystalline buffer layer is a layer comprising sapphire. Layers of these materials may be fabricated in particular on large scale Si-wafers. This may further facilitate an efficient mass fabrication of crystalline metal-phosphides.

According to embodiments, the metal-source layer may be a metal-oxide layer. According to other embodiments, the metal-source layer may be a metal-nitride layer.

According to an embodiment, the metal-oxide layer is a layer comprising $WO_3$ and the metal phosphide layer is a layer comprising $WP_2$. Such a method may allow the efficient fabrication of $WP_2$ layers. This in return may be used to fabricate devices for a plurality of applications, in particular neuromorphic applications. In addition, it may be used to fabricate devices for quantum computing via gateable superconductivity.

According to another embodiment, the metal-oxide layer is a layer comprising $MoO_3$ and the metal phosphide layer is a layer comprising $MoP_2$.

According to another embodiment, the metal-oxide layer is a layer comprising wolfram-oxide, e.g. $W_2O_3$, $WO_2$ or $WO_3$ and the metal phosphide layer is a layer comprising WP.

According to another embodiment, the metal-oxide layer is a layer comprising niobium oxide, e.g. NbO, $NbO_2$ or $Nb_2O_5$ and the metal phosphide layer is a layer comprising NbP.

According to an embodiment, the step of forming the buffer layer is performed by molecular beam epitaxy. According to other embodiments, the step of forming the buffer layer may be performed by atomic layer deposition, pulsed laser deposition or chemical vapor deposition.

According to embodiments, the metal-source layer may be formed by molecular beam epitaxy, sputtering, atomic layer deposition, pulsed laser deposition or chemical vapor deposition.

According to an embodiment, the chemical conversion reaction is performed by an annealing in a phosphorous environment. The annealing may be performed in particular at a temperature range of 600 degree Celsius to 1000 degree Celsius. According to an embodiment, the chemical conversion reaction may be a solid-phase phosphidation. According to an embodiment, the chemical conversion reaction may be performed in a chemical vapor deposition (CVD) reactor. The precursor may be in particular TBP or phosphine.

According to an embodiment, the crystalline metal phosphide layer has a thickness of less than 10 μm. Such thin layers facilitate the conversion of the metal-source layer into the metal phosphide layer.

According to an embodiment, the method further comprises a step of patterning the metal source-layer. Such a patterning of the metal-source layer increases the surface to volume ratio of the metal-source layer. And this may facilitate the conversion of the metal-source layer into the metal phosphide layer.

According to an embodiment of another aspect of the invention, a method for fabricating a crystalline metal-phosphide hetero-layer is provided. The method comprises steps of providing a crystalline base substrate, forming a crystalline buffer layer on the crystalline base substrate, forming a first crystalline metal-source layer comprising a first metal source on the crystalline buffer layer and forming a second crystalline metal-source layer comprising a second metal-source on the first crystalline metal-source layer. The method comprises a further step of performing a chemical conversion reaction to convert the first metal-source layer in a first crystalline metal phosphide layer and performing a chemical conversion reaction to convert the second metal-source layer in a second crystalline metal phosphide layer.

Such a method may allow to fabricate hetero-structures with advanced device functionalities. The conversion of the first metal-source layer and the second metal-source layer may be performed in particular simultaneously.

According to an embodiment of another aspect, a crystalline structure comprising a base substrate of crystalline silicon, a crystalline buffer layer on the base substrate and a first crystalline metal phosphide layer on the buffer layer is provided.

The base substrate may comprise silicon and may have in particular a (100) crystal orientation. The crystalline buffer layer may be in particular a layer comprising $SrTiO_3$. The first metal phosphide layer may be in particular a layer of $WP_2$ or a layer of $MoP_2$.

According to an embodiment, a second crystalline metal phosphide layer may be provided on the first crystalline metal phosphide layer. Such a hetero-structure may offer advanced device functionalities.

If not indicated otherwise, the steps of the different aspects of the invention may be performed in different orders. Furthermore, the steps may also be combined, i.e. that e.g. two or more steps may be performed together.

Advantages of the features of one aspect of the invention may apply to corresponding features of another aspect of the invention.

Embodiments of the invention will be described in more detail below, by way of illustrative and non-limiting examples, with reference to the accompanying drawings.

BRIEF DESCRIPTION OF THE DRAWINGS

FIG. 1e shows a structure comprising a patterned metal-source layer comprising three fin structures;

FIG. 1f shows a structure comprising three fin structures of metal phosphide;

FIG. 2d shows a structure after a patterning of the second metal phosphide layer;

FIG. 2e shows a device structure after electrical contacts have been formed.

DETAILED DESCRIPTION

FIGS. 1a to 1f and FIGS. 2a to 2e subsequently described below generally show enlarged cross-sectional views in an y-z plane of initial, intermediate and final structures formed during the stages of methods according to embodiments of the invention. In any or all of the figures the dimensions may not be drawn to scale and may be shown in a simplified and schematic way to illustrate the features and principles of embodiments of the invention.

FIGS. 1a-d show successive stages of a method for fabricating a crystalline metal-phosphide layer according to an embodiment of the invention.

Figure 1A:
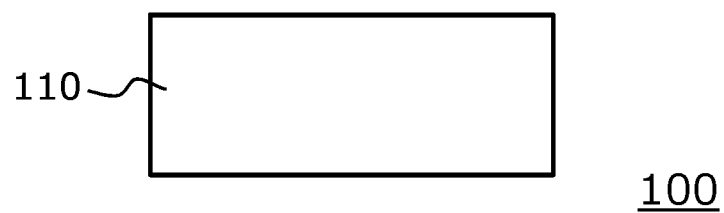
FIG. 1a illustrates a cross-sectional view of an initial structure comprising a crystalline base substrate.

FIG. 1a illustrates a cross-sectional view of an initial structure 100. The initial structure 100 comprises a crystalline base substrate 110. The base substrate 110 comprises a semiconductor material and may be e.g. a bulk semiconductor substrate, a substrate comprising an insulating layer such as a silicon on insulator (SOI) substrate or a hybrid substrate. The base substrate 110 may be in particular embodied as a crystalline semiconductor wafer of a large diameter. The base substrate may comprise in particular a material from group IV of the periodic table as semiconductor material. According to an embodiment, the base substrate may be in particular a silicon-substrate. The silicon-substrate may have in particular a (100) crystal orientation. According to other embodiments, the base substrate 110 may comprise germanium, mixed silicon and germanium, mixed silicon and carbon, mixed silicon germanium and carbon and the like.

Figure 1B:
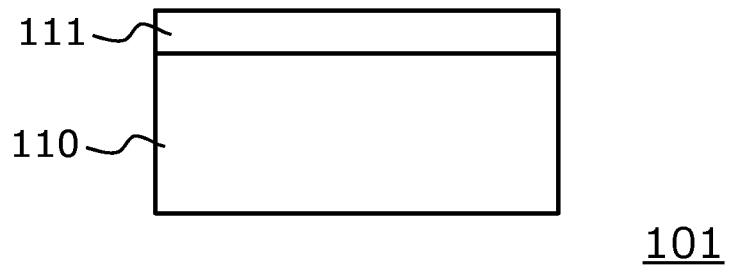
FIG. 1b shows a cross-sectional view of a structure comprising a crystalline buffer layer formed on the crystalline base substrate.

FIG. 1b shows a structure 101 after a crystalline buffer layer 111 has been formed on the crystalline base substrate 110. According to embodiments, the crystalline buffer layer is a layer of $SrTiO_3$ (STO). According to another embodiment, the crystalline buffer layer is a layer of sapphire.

The buffer layer 111 may be generally formed by any suitable deposition technique. According to an embodiment, the buffer layer 111 is formed by molecular beam epitaxy. According to other embodiments, the buffer layer 111 may be formed by sputtering, atomic layer deposition, pulsed laser deposition or chemical vapor deposition.

Details of one possible method to form a layer of STO on Silicon are disclosed in the document "Crystalline Oxides on Silicon: The First Five Monolayers", R. A. McKee, F. J. Walker, and M. F. Chisholm, Phys. Rev. Lett. 81, 3014— Published 5 Oct. 1998.

Figure 1C:
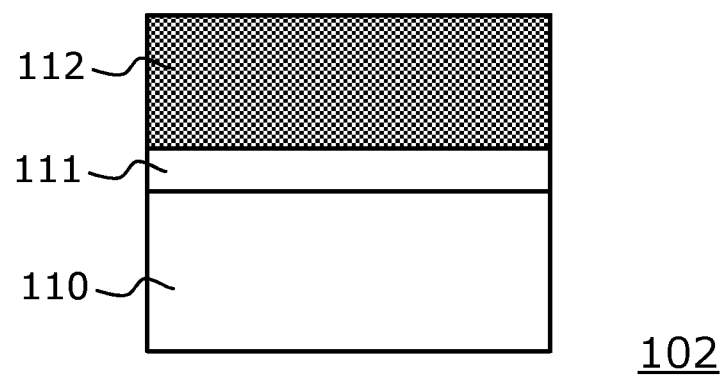
FIG. 1c shows a cross-sectional view comprising a crystalline metal-source layer on the crystalline buffer layer.

FIG. 1c shows a structure 102 after a crystalline metal-source layer 112 has been formed on the crystalline buffer layer 111. According to embodiments a metal source-layer shall be understood as a layer that comprises a metal, in particular a metal compound. The metal of the metal-source layer provides the metal for the subsequent formation of the metal-phosphide. The metal-source layer 112 may be in particular embodied as a metal-oxide layer. According to embodiments, the metal-source layer 112 may be a layer of $WO_3$. According to other embodiments, the metal-source layer 112 may be a layer of $MoO_3$. According to other embodiment, metal nitride layers may be used as metal source layers.

According to embodiments, the metal-source layer 112 may be formed by molecular beam epitaxy, by sputtering, by atomic layer deposition, by pulsed laser deposition or by chemical vapor deposition.

Figure 1D:
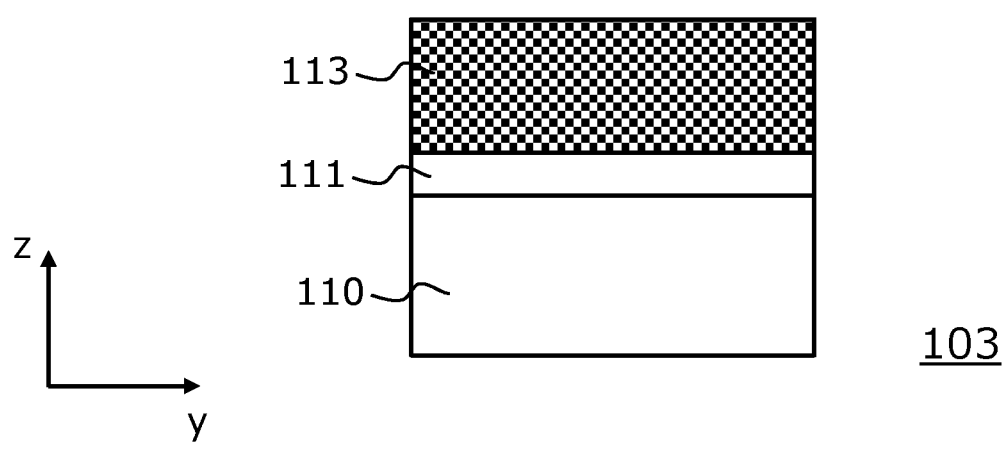
FIG. 1d shows a structure comprising a crystalline metal phosphide layer formed on the buffer layer by conversion of the metal-source layer.

FIG. 1d shows a structure 103 after a crystalline metal phosphide layer 113 has been formed on the crystalline buffer layer 111. More particularly, the metal-phosphide layer 113 has been formed by a chemical conversion reaction. The chemical conversion reaction has converted the metal-source layer 112 in the crystalline metal phosphide layer 113. This is illustrated in FIG. 1c and FIG. 1d by different patterns for the metal-source layer 112 and the metal-phosphide layer 113.

According to an embodiment, the chemical conversion reaction may be performed by an annealing of the structure 112 in a phosphorous environment. The annealing may be in particular performed at a temperature range between 600° C. to 1000° C. According to embodiments, the annealing may be performed for a duration between a few minutes to a few hours, in particular between a duration of 1 minute to 10 hours. The chemical conversion reaction may be in particular a solid-phase phosphidation. In other words, the starting material of the chemical conversion reaction, i.e. the material of the metal-source layer, e.g. the $WO_3$ crystals or the $MoO_3$ crystals, remain in the solid form during the chemical conversion reaction, while the phosphor may be in a gaseous phase. According to embodiments, the chemical conversion reaction is performed in a controlled atmosphere, in particular in a chemical vapor deposition (CVD) reactor. The controlled atmosphere may provide in particular an over-pressure of phosphor. The precursor may be in particular Tertiarybutylphosphine (TBP) as metal-organic precursor or phosphine (PH3) as hydride precursor.

According to another embodiment, the chemical conversion reaction may be performed by exposing the metal-source layer in a closed vacuum tube or vacuum chamber with phosphorous powder.

The crystalline metal phosphide layer 113 may have a thickness of less than 10 μm. According to further embodiments, the crystalline metal phosphide layer may have a thickness of less than 1 μm. Such a thin layer facilitates an efficient and fast chemical conversion reaction.

According to embodiments, the metal-oxide layer may be a layer of $WO_3$ and the metal phosphide layer a layer of $WP_2$. According to such embodiments, the oxygen of the metal oxide layer is replaced during the chemical conversion step with phosphor.

According to another embodiment, the metal-oxide layer is a layer of $MoO_3$ and the metal phosphide layer is a layer of $MoP_2$. According to such an embodiment the oxygen of the $MoO_3$-layer is replaced during the chemical conversion step with phosphor.

As a result of the steps described above, the crystalline structure 103 has been formed which comprises a substrate 110 of e.g. crystalline silicon, a crystalline buffer layer 111 on the substrate 110 and a crystalline metal phosphide layer 113 on the buffer layer 111.

FIG. 1e and FIG. 1f illustrate an alternative embodiment of a method to fabricate metal-phosphide crystals. The method according to this embodiment uses the same steps as illustrated in FIGS. 1a to 1c and differs only by replacing the step as illustrated in FIG. 1d with the steps as illustrated in FIGS. 1e and 1f.

Starting from the structure 102 as shown in FIG. 1c, the metal-source layer 112 is patterned. This patterning has formed in this example a structure 104 as shown in FIG. 1e comprising three fin structures 112a, 112b and 112c of the metal-source layer 112. The patterning may be performed e.g. by lithography and subsequent etching. The patterning may provide on the one hand structures for devices to be formed subsequently. On the other hand, the patterning optimizes the surface to volume ratio of the metal-source layer and hence facilitates the subsequent chemical conversion.

FIG. 1f shows a structure 105 after three crystalline fin structures 113a, 113b and 113c of metal phosphide have been formed on the metal-source layer 112. More particularly, the metal phosphide fin structures 113a, 113b and 113c have been formed by a chemical conversion reaction which has converted the metal-source fin structures 112a, 112b and 112c into the crystalline metal phosphide fin structures 113a, 113b and 113 respectively. This is illustrated in FIG. 1e and FIG. 1f by different patterns for the metal-source fin structures and the metal-phosphide fin structures.

FIGS. 2a-2e show successive stages of a method for fabricating a crystalline metal-phosphide hetero-layer according to an embodiment of the invention.

Figure 2A:
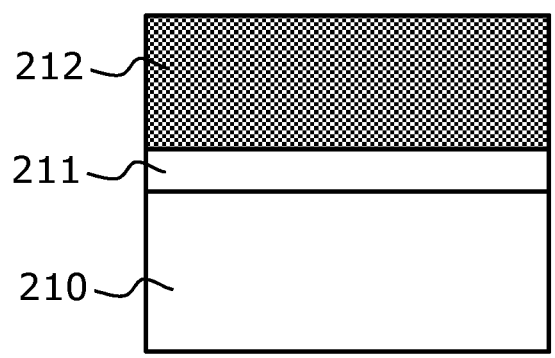
FIG. 2a shows a structure corresponding to the structure of FIG. 1c comprising a base substrate, a buffer layer and a first metal-source layer.

FIG. 2a shows a structure 201 that corresponds to the structure 102 as shown in FIG. 1c and may be formed with steps corresponding to the steps as described above with reference to FIGS. 1a to 1c. More particularly, the structure 201 has been formed by steps as follows. At first, a crystalline base substrate 210 has been provided. Then, a crystalline buffer layer 211 has been formed on the crystalline base substrate 210. Next a first crystalline metal-source layer 212 comprising a first metal source has been formed on the crystalline buffer layer 211.

Figure 2B:
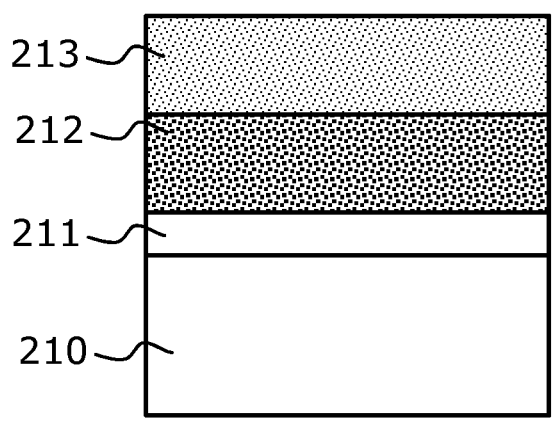
FIG. 2b shows a structure comprising a second crystalline metal-source layer on the first crystalline metal-source layer.

Referring to FIG. 2b, a structure 202 has been formed, starting from the structure 201. More particularly, a second crystalline metal-source layer 213 has been formed on the first crystalline metal-source layer 212.

The second crystalline metal-source layer 213 may be formed with the same methods as the first crystalline metal-source layer 212, e.g. by sputtering, by atomic layer deposition, by pulsed laser deposition or by chemical vapor deposition.

Figure 2C:
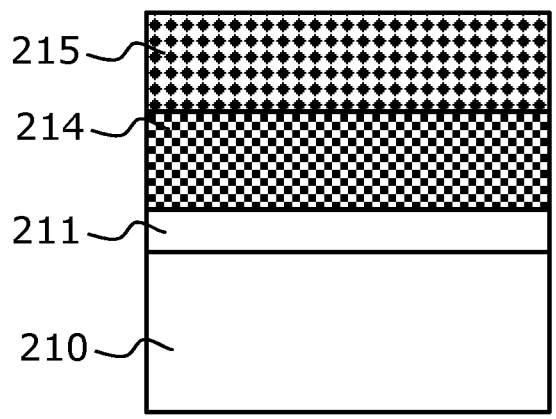
FIG. 2c shows a hetero-structure comprising a first crystalline metal phosphide layer and a second crystalline metal phosphide layer.

FIG. 2c shows a structure 203 after a chemical conversion reaction has been performed. More particularly, the chemical conversion reaction has converted the first metal-source layer 212 in a first crystalline metal phosphide layer 214 and the second metal-source layer 213 in a second crystalline metal phosphide layer 215. This is illustrated in FIG. 2b and FIG. 2c by different patterns for the metal-source layers and the metal-phosphide layers.

According to an embodiment, the first metal-source layer 212 may be a layer of $WO_3$, the second metal-source layer 213 may be a layer of $MoO_3$, the first metal phosphide layer 214 may be a layer of $WP_2$ and the second metal phosphide layer 215 a layer of $MoP_2$.

According to another embodiment, the first metal-source layer 212 is a layer of $MoO_3$, the second metal-source layer 213 is a layer of $WO_3$, the first metal phosphide layer 214 is a layer of $MoP_2$ and the second metal phosphide layer 215 is a layer of $WP_2$.

FIG. 2d shows a structure 204 after a patterning of the second metal phosphide layer 215. This patterning has formed in this example a structure 215a. The patterning may be performed e.g. by lithography and subsequent etching.

As a result of the steps described above, a crystalline structure 204 has been formed which comprises a substrate 210 of e.g. crystalline silicon, a crystalline buffer layer 211 on the substrate 210, a first crystalline metal phosphide layer 214 on the buffer layer 211 and a second crystalline metal phosphide layer 215 on the first crystalline metal phosphide layer 214.

FIG. 2e shows a device structure 205 after electrical contacts 216a, 216b and 216c have been formed. The device structure 205 may form e.g. a heterojunction transistor, in which the contact 216a acts as a source, the contact 216c acts as a drain and 216b acts as a gate contact.

Figure 3:
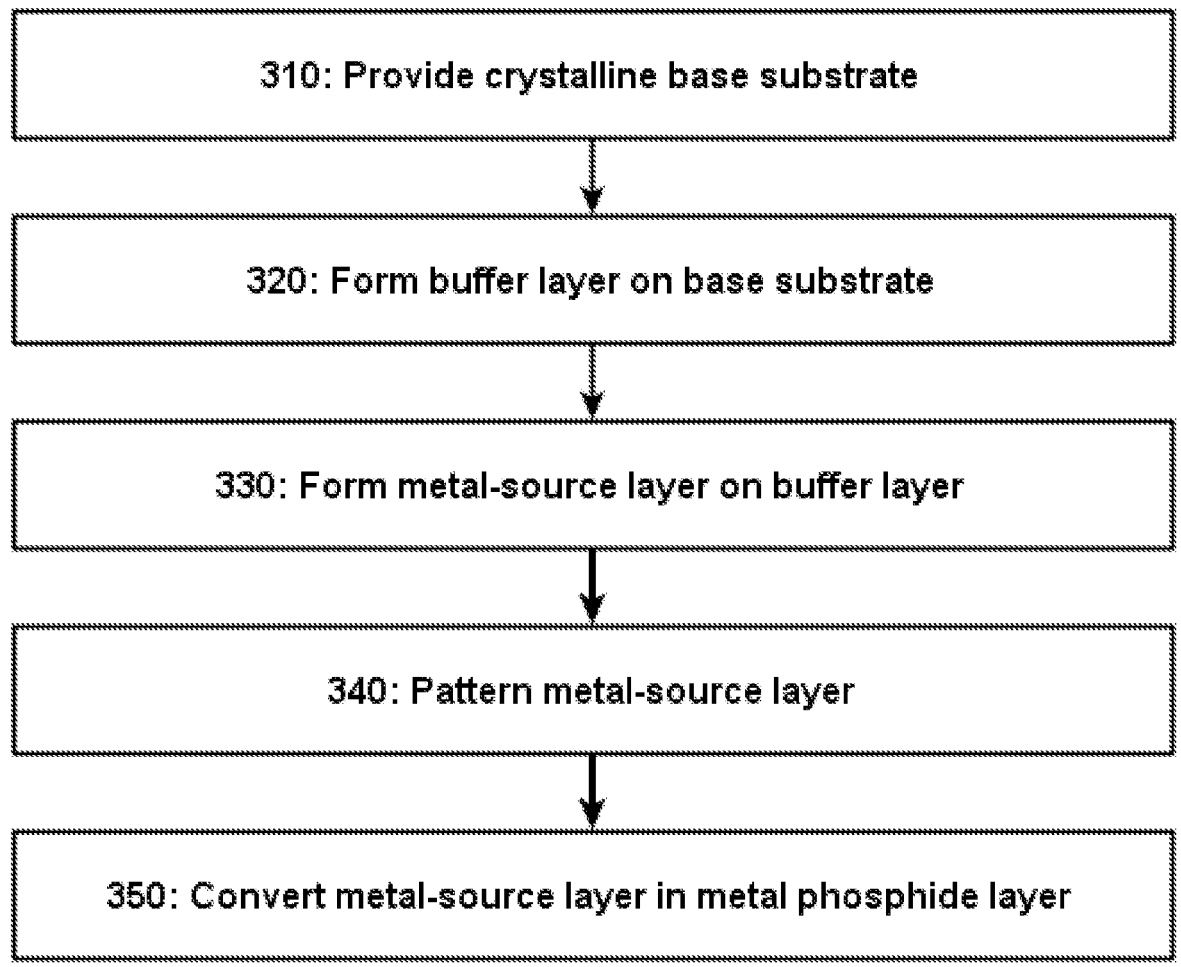
FIG. 3 shows flow charts of method steps of a method for fabricating crystalline metal-phosphide layers according to an embodiment of the invention.

FIG. 3 shows flow charts of method steps of a method for fabricating crystalline metal-phosphide layers according to an embodiment of the invention.

At a step 310, a crystalline base substrate is provided.

At an optional step 320, a crystalline buffer layer is formed on the crystalline base substrate.

At a step 330, a crystalline metal-source layer is formed on the crystalline buffer layer.

According to some embodiments, step 320 may be omitted and the crystalline metal-source layer is formed directly on the base substrate.

At an optional step 340, the metal-source layer is patterned.

At a step 350, a chemical conversion reaction is performed. The chemical conversion reaction converts the metal-source layer in a crystalline metal phosphide layer.

While illustrative examples are given above, it will be appreciated that the basic fabrication steps described above can be used to produce crystalline structures and substrates of other materials, shapes and sizes. Materials and processing techniques can be selected as appropriate for a given embodiment.

While particular examples have been described above, numerous other embodiments can be envisaged.

The disclosed crystalline structures and substrates can be part of a chip. The resulting integrated circuit chips can be distributed by the fabricator in raw wafer form (that is, as a single wafer that has multiple unpackaged chips), as a bare die, or in a packaged form. In any case the chip may be integrated with other chips, discrete circuit elements, and/or other signal processing devices as part of either an intermediate product or an end product. The end product can be any product that includes integrated circuit chips.

While in the above described examples a crystalline buffer layer has been provided between the crystalline base substrate and the crystalline metal-source layer, other embodiments may be envisaged according to which no buffer layer is used and the crystalline metal-source layer is formed directly on the base substrate.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a crystalline metal-phosphide hetero-layer, the method comprising;
    providing a crystalline base substrate;
    forming a crystalline buffer layer on the crystalline base substrate;
    forming a first crystalline metal-source layer comprising a first metal source on the crystalline buffer layer, wherein the first crystalline metal-source is a metal oxide of W, Mo or Nb, or a metal nitride of W, Mo or Nb;
    forming a second crystalline metal-source layer comprising a second metal-source on the first crystalline metal-source layer, wherein the second crystalline metal-source is a metal oxide of W, Mo or Nb, or a metal nitride of W, Mo or Nb and is compositionally different from the first metal-source;
    performing a chemical conversion reaction to convert the first crystalline metal-source layer into a first crystalline metal phosphide layer; and
    performing a chemical conversion reaction to convert the second crystalline metal-source layer into a second crystalline metal phosphide layer.

2. The method of claim 1, wherein the base substrate comprises silicon.

3. The method of claim 2, wherein the base substrate has a (100) crystal orientation.

4. The method of claim 1, wherein the crystalline buffer layer is a layer comprising $SrTiO_3$.

5. Thee method of claim 1, wherein the crystalline buffer layer is a layer comprising sapphire.

6. The method of claim 1, wherein the first crystalline metal-source layer is a layer comprising $WO_3$, the second crystalline metal-source layer is a layer comprising $MoO_3$, the first crystalline metal phosphide layer is a layer comprising $WP_2$, and the second crystalline metal phosphide layer is a layer comprising $MoP_2$.

7. The method of claim 1, wherein the first crystalline metal-source layer is a layer comprising $MoO_3$, the second crystalline metal-source layer is a layer comprising $WO_3$, the first crystalline metal phosphide layer is a layer comprising $MoP_2$, and the second crystalline metal phosphide layer is a layer comprising $WP_2$.

8. The method of claim 1, wherein the chemical conversion reaction is performed by an annealing in a phosphorous environment.

9. The method of claim 8, wherein the annealing is performed at a temperature range of 600° C. to 1000° C.

10. The method of claim 1, wherein the chemical conversion reaction is a solid-phase phosphidation.

11. The method of claim 1, wherein the chemical conversion reaction is performed in a chemical vapor deposition (CVD) reactor with a precursor selected from the group consisting of: tertiarybutylphosphine (TBP) and phospine ($PH_3$).

* * * * *